Sept. 26, 1961 R. R. SCOVILLE 3,002,044

CASE FOR ELECTRONIC MODULAR UNITS

Original Filed Nov. 26, 1954

INVENTOR.

RAY R. SCOVILLE

BY Nicholas T. Volsi

ATTORNEY.

3,002,044

CASE FOR ELECTRONIC MODULAR UNITS

Ray R. Scoville, 5083 Commonwealth Ave., La Canada, Calif.

Original application Nov. 26, 1954, Ser. No. 471,296, now Patent No. 2,892,009, dated June 23, 1959. Divided and this application Oct. 16, 1958, Ser. No. 767,550
8 Claims. (Cl. 174—50)

This invention relates to electronic assemblies and more particularly to case-mounted modular units of such assemblies.

This application is a division of the parent application Serial No. 471,296, filed November 26, 1954, and entitled "Encased Electronic Modular Units," now U.S. Patent No. 2,892,009.

Modular units in electronic assemblies in many instances must be mechanically self-contained units including thermionic tubes, tube sockets, means for mounting circuit components, multiple prong plugs for connecting these units to larger units, and cases or boxes providing the outer walls and shielding means for the units. The invention discloses the units of the above type integrated into compact, modular structures.

Modular electronic units are now an accepted structural or layout standard in a larger part of electronic industry. Such units include printed circuits, printed circuit assemblies, and a large number of integrated electronic structures including a plurality of vertical or horizontal panels with electronic components mounted in a variety of ways on or between the panels. One example of such units is disclosed in the application for patent of the same inventor filed April 12, 1955, having a Serial No. 500,850, now U.S. Patent No. 2,913,634, and entitled "Electronic Modular Units." Structures of this type often require an external housing means providing a mechanical packaging and shielding means for such units. The invention discloses novel external packaging means for electronic units, and means for integrating the disclosed packaging units or cases with modular electronic units. The disclosed case provides greater accessibility, simplicity and utility than similar cases of the prior art, and can be integrated or used with the modular electronic units more readily and more advantageously than the known cases by providing greater accessibility, to the electronic components by being readily dismounted and completely separated from the electronic components, and by also providing panel space on the inner surfaces of the housing for mounting electronic components.

It is therefore, an object of this invention to provide improved case-enclosed modular electronic units.

An additional object of this invention is to provide novel case-enclosed electronic modular units in which the case consists of two covers and two L-shaped side-walls held together with two corner studs.

Still another object of this invention is to provide case-enclosed electronic modular units of great flexibility, compactness, accessibility, and having self-locking features.

In providing for the foregoing objects and advantages, the modular units, in accordance with this invention, comprise an electronic assembly per se and the case surrounding it. The electronic assembly may take a variety of forms, but, in general, it includes tubes, tube sockets, tube shields and shield bases, a plurality of socket turrets, or deck or wall turrets having a plurality of horizontal or vertical insulation strips held in spaced relationship with respect to each other by riser wires or other means with the circuit components mounted either parallel or perpendicular to the strips. The turrets are provided with multiple plug prongs, the prongs and the tube sockets being connected to the turrets. This electronic assembly is surrounded with a case which may take several forms:

all forms have rectangular top and bottom covers; between these two covers there are four side-walls with rounded corners. The four side-walls of the case may comprise two L-shaped pieces, each leg of the L-shaped member constituting a wall, as illustrated in FIGS. 1 and 2, the two L pieces defining a rectangle. The entire case can be put around the electronic assembly and taken apart without disturbing the electronic assembly. All side-walls of the casing may be made of perforated material to provide ample ventilation for the electronic assembly. The casing is held together by two corner posts, internally threaded at the ends to receive screws with the result that loosening of two screws permits dismantling the case and separating it from the electronic assembly.

The foregoing objects, advantages and construction of the present invention will be more readily seen from the following description and accompanying drawings in which.

Figure 1:
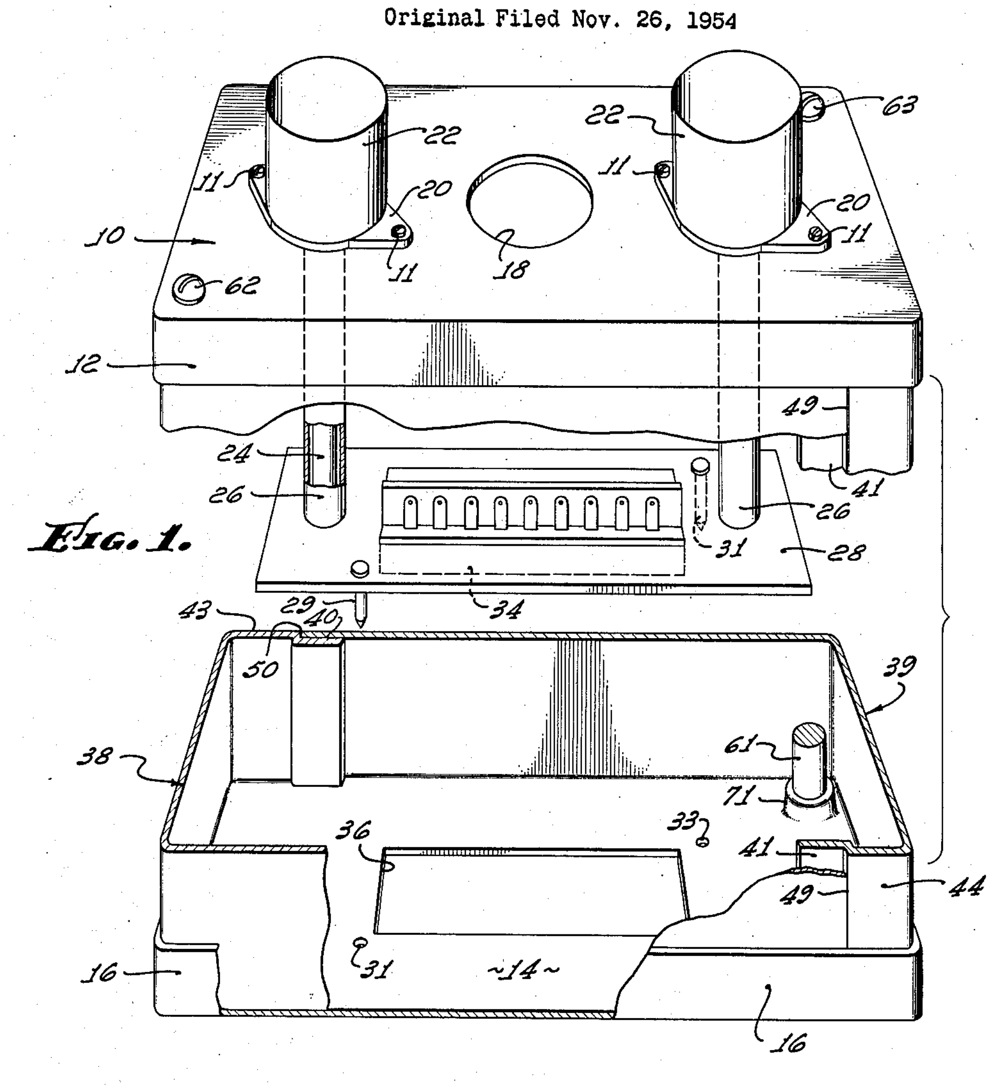
FIGURE 1 is a partially exploded perspective view of a case.
Figure 2:
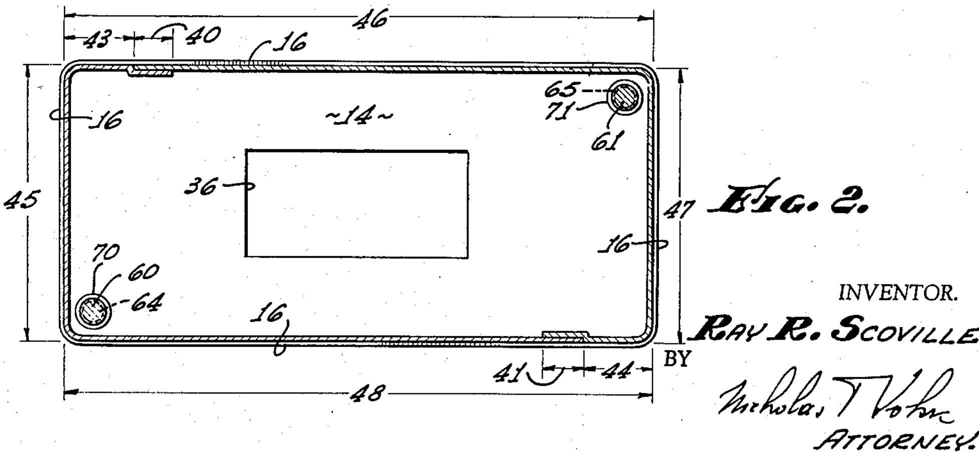
FIGURE 2 is a plan sectional view of the mounting cases illustrated in FIG. 1.

Referring to FIGS. 1 and 2, the case comprises a top cover 10 having four bent-over side edges or side flanges 12 and a bottom cover 14 with four side flanges 16. The two covers have the same outside dimensions. The top cover may have a plurality of circular openings 18 for inserting and mounting tube sockets 20 and shield bases 22 which are fastened to the cover by screws 11. Centrally located holes in the tube sockets are used for mounting bolts 24 which are surrounded with insualting sleeves 26. Sleeves 26 also act as spacers for mounting an insulating strip or strips 28 provided with terminals (not shown) for mounting circuit components in a plane parallel and at right angles to the strip. The bottom strip is provided with a multiple prong plug 34 attached to strip 28. The bottom cover is provided with an opening 36 for accommodating the prong portion of plug 34 and orifices 31 and 33 for guide prongs 29 and 31 attached to strip 28. The case also includes two L-shaped side-wall members 38 and 39, each member being provided with inwardly offset rabbets 40 and 41 which are used for receiving a complementary side-panel of the adjoining L-shaped member. The depth of the offset for the flanges 40 and 41 is equal to the thickness of the panel members 38 and 39, as illustrated in FIGS. 1 and 2, with the result that the outside surfaces of the panels and of adjacent surfaces 42 and 43 lie in the same respective planes. In this manner the four side-walls 45, 46, 47 and 48 of the case represent a continuous rectangular surface with only two lines 49 and 50 to indicate that the four side-walls are composed of two L-shaped members matching each other along two overlapping seams.

The vertical dimensions of the L-shaped members are equal, and the top and bottom covers, therefore, rest directly on the side-edges of the L-shaped members 38 and 39. The flanges 12 and 16 of the two covers overlap the side members 38 and 39 in the manner indicated in the figures. The case is held together by two posts 60 and 61 internally threaded at the ends to receive screws 62 and 63 on the top and two identical screws 64 and 65 on the bottom, the posts being placed at diagonally opposite corners. The length of the bolts is equal to the height of the side members 38 and 39 reduced by the vertical dimensions of the staples 70 and 71. The bottom cover 14 is dimpled inwardly for recessing the holding screws so that the multi-prong plug 34 can engage its corresponding member without interference with the heads of the set-screws.

The entire case is assembled by first attaching the electronic assembly to cover 10 which is accomplished by means of set-screws 11. Rods 60 and 61 are then attached to the bottom cover 14 by the set-screws 64 and 65; the two L-shaped members are than placed on the bottom cover in the manner illustrated in FIGS. 1 and 2, and then the top cover and the electronic assembly are placed into the open box formed by the bottom cover 14 and the four walls, with the top cover closing this box. The set-screws 62 and 63 are then screwed into the seats in the rods 60 and 61, which completes the assembling. From the above it follows that the entire case, except for cover 10, may be dismantled and removed from the electronic assembly by loosening only two set-screws 62 and 63.

The electronic circuit components may be mounted in a variety of ways, as described more fully in my copending application Serial No. 500,850, filed April 12, 1955, now U.S. Patent No. 2,913,634, and entitled "Electronic Modular Units," which is made a part of this disclosure. The modular units can be also mounted on one of the L members 38 or 39, if such type of mounting is desired in some specific configuration of elements. It is to be understood also that the dimensions of the covers and of the L-shaped members can be altered in any desired manner.

What is claimed is:

1. A modular electronic unit including an electronic assembly and a case for housing said electronic assembly, said case comprising a rectangular box having identical top and bottom covers, said covers including apertures therein for receiving portions of said assembly whereby said electronic assembly includes elements within said case as well as further elements protruding from said case adjacent said apertures, each cover having a continuous bent-over flange, and four mutually perpendicular side-walls composed of two identical unitary substantially L-shaped members having a central portion integrally connected to bent-over long and short portions corresponding to the long and short legs of said L, said short portion including, and terminating, in an integral inwardly offset rabbet, the long portion of each L overlying the rabbet portion of the other L for making up four walls, said covers closing off said walls, and post means extending between said covers within the area bounded by said four walls for holding the covers and side walls of said case in rigid engagement with respect to each other thereby to encase those portions of said assembly which are located within said case.

2. A modular electronic unit including an electronic assembly and a case for housing said electronic assembly, said case comprising first and second rectangular covers, each cover having four continuous side edges extending in four transverse planes perpendicular to each other and perpendicular to the plane of the cover, first through fourth side-walls lying, respectively, in said four planes with the side-edges of the covers overlying the correspond adjacent portions of said four side-walls, said four side-walls comprising first and second substantially L-shaped members, each L-shaped member including as integral portions thereof, a long wall member, an intermediate wall member extending transverse to said long wall member, and a short wall member extending transverse to said intermediate wall member and substantially parallel to said long wall member, said L-shaped members being mounted in opposed relation to one another between said covers, the long and the short wall members of the first and second L-shaped members, respectively, constituting the first complete side-wall of said case, the long and short wall members of the second and first members, respectively, constituting the second complete side-wall of said case, parallel to said first side-wall, and the intermediate wall members of the first and second L-shaped members constituting, respectively, the third and the fourth side-walls of said case, said third and fourth walls being parallel to each other and being held in spaced relationship with respect to each other by said first and second wall members, at least one post removably mounted within said case and between said first and second covers for holding said covers and side-walls in fixed relationship with respect to each other, and first and second means for removably fastening the opposing ends of said post to said covers, respectively, said case being completely dismantled by removing, or loosening, one of said fastening means, said electronic assembly being attached as a unit to one of said covers whereby, upon dismantling of said case, said one cover and attached unit may be physically separated from said first and second L-shaped members and from the other of said covers without disturbing said electronic assembly.

3. The case as defined in claim 2 in which said short wall member of each L-shaped member comprises a flange bent over at right angle with respect to said intermediate member, and an inwardly offset rabbet for receiving the outer end of the long member of the complementary L-shaped member.

4. A modular electronic unit including an electronic assembly and a case for mounting and shielding said electronic assembly, said case including first through fourth side-walls composed solely of two substantially L-shaped members mounted in opposed relationship to one another, each member including a first rectangular plate constituting the greater part of the first and third walls, respectively, of said case, a second rectangular plate integral with said first plate and bent over at substantially a right angle with respect to the first plate, said second plate constituting, respectively, the second and the fourth side-walls of said case, said second and fourth walls being parallel to each other and being held in spaced relationship with respect to each other by said first and third walls, each of said L-shaped members also including an integral flange bent over at substantially a right angle to the second plate, and an inwardly offset rabbet, said flange and the rabbet constituting, respectively, the integral and the completing portions of the first and third walls, first and second rectangular covers each having a continuous flange overlying the adjacent portions of said four side walls, two posts mounted within said case in two diagonally opposite corners of said case, and means for fastening the four ends of said posts to the respective covers of said case whereby the constituent members of said case, comprising said two L-shaped members and said two covers, may be completely disassembled from one another by disengagement of said fastening means, said electronic assembly being attached as a unit to one of said constituent members of said case to permit complete disassembly of said case without disturbing said unit, at least one of said constituent members of said case defining an aperture whereby access may be had to at least a portion of said electronic assembly without requiring disassembly of said case.

5. The combination of claim 4 wherein said electronic assembly is attached as a unit to, and depends downwardly into said case from, an upwardly disposed one of said covers.

6. The combination of claims wherein said aperture is located in one of said covers, a portion of said assembly protruding through said aperture to the exterior of said case.

7. The combination of claim 6 wherein said electronic assembly is attached as a unit to the other of said covers.

8. The combination of claim 4 wherein said electronic assembly is attached as a unit to, and extends from, one of said L-shaped members.

References Cited in the file of this patent

UNITED STATES PATENTS

| | | |
|---|---|---|
| 889,899 | Brown | June 9, 1908 |
| 977,643 | Manguais | Dec. 6, 1910 |

(Other references on following page)

UNITED STATES PATENTS

| | | |
|---|---|---|
| 1,828,088 | Robinson | Oct. 20, 1931 |
| 2,076,811 | Ehlers | Apr. 13, 1937 |
| 2,167,525 | Rosendale | July 25, 1939 |
| 2,376,414 | Billner | May 22, 1945 |
| 2,538,070 | Wright et al. | Jan. 16, 1951 |
| 2,892,009 | Scoville | June 23, 1959 |

FOREIGN PATENTS

| | | |
|---|---|---|
| 123,192 | Australia | Dec. 19, 1946 |